United States Patent
Afentakis

(10) Patent No.: US 9,363,889 B2
(45) Date of Patent: Jun. 7, 2016

(54) PIXEL DESIGN FOR FLEXIBLE ACTIVE MATRIX ARRAY

(71) Applicant: Sharp Laboratories of America (SLA), Inc., Camas, WA (US)

(72) Inventor: Themistokles Afentakis, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

(21) Appl. No.: 14/470,618

(22) Filed: Aug. 27, 2014

(65) Prior Publication Data

US 2016/0066408 A1    Mar. 3, 2016

(51) Int. Cl.
| | | |
|---|---|---|
| *G02F 1/1343* | (2006.01) | |
| *G02F 1/136* | (2006.01) | |
| *H05K 1/02* | (2006.01) | |
| *G02F 1/1368* | (2006.01) | |
| *G02F 1/1333* | (2006.01) | |
| *H01L 27/12* | (2006.01) | |
| *H01L 27/146* | (2006.01) | |
| *H01L 27/15* | (2006.01) | |
| *H01L 27/32* | (2006.01) | |
| *H01L 51/00* | (2006.01) | |

(52) U.S. Cl.
CPC .............. *H05K 1/028* (2013.01); *G02F 1/1368* (2013.01); *G02F 1/133305* (2013.01); *G02F 1/134336* (2013.01); *H01L 27/124* (2013.01); *H01L 27/1218* (2013.01); *H01L 27/14612* (2013.01); *H01L 27/15* (2013.01); *H01L 27/3244* (2013.01); *H01L 51/0097* (2013.01); *H05K 1/0296* (2013.01); *H01L 2251/5338* (2013.01)

(58) Field of Classification Search
CPC .................. G02F 1/133305; G02F 1/136286; H01L 21/02675
See application file for complete search history.

(56) References Cited

U.S. PATENT DOCUMENTS

| | | | | |
|---|---|---|---|---|
| 5,146,356 | A * | 9/1992 | Carlson ................. | G02F 1/1362 349/145 |
| 7,221,012 | B2 * | 5/2007 | Chu .................. | G02F 1/136286 257/290 |
| 7,601,942 | B2 | 10/2009 | Underwood et al. | |
| 7,705,952 | B2 * | 4/2010 | Lee ........................ | G02F 1/1345 349/149 |
| 7,957,151 | B2 | 6/2011 | Aita et al. | |
| 8,314,766 | B2 * | 11/2012 | Chang .................. | G09G 3/3648 345/87 |
| 2007/0019143 | A1 * | 1/2007 | Chen ................. | G02F 1/136286 349/139 |
| 2007/0242202 | A1 * | 10/2007 | Kawase .............. | H01L 27/3244 349/139 |
| 2009/0207358 | A1 | 8/2009 | Lee et al. | |
| 2012/0062447 | A1 * | 3/2012 | Tseng ............... | G02F 1/136286 345/33 |

\* cited by examiner

*Primary Examiner* — Joseph L Williams
(74) *Attorney, Agent, or Firm* — Law Office of Gerald Maliszewski; Gerald Maliszewski

(57) ABSTRACT

A flexible active matrix array is provided, made with a flexible substrate and an array of pixels overlying the substrate, where each pixel includes an active device and a light controlling device. The array also includes a plurality of parallel row lines overlying the substrate, with each row line formed in serpentine pattern with a plurality of partial-loops, to supply a first signal to a corresponding plurality of pixels. A plurality of parallel column lines overlies the substrate, orthogonal to the row lines. Each column line is formed in a serpentine pattern with a plurality of partial-loops, to supply a second signal to a corresponding plurality of pixels. Each pixel has a border, with each row line partial-loop formed along about 75% of a pixel border, and each column line partial-loop formed along about 75% of a pixel border. Also provided is a printed circuit board with serpentine traces.

21 Claims, 3 Drawing Sheets

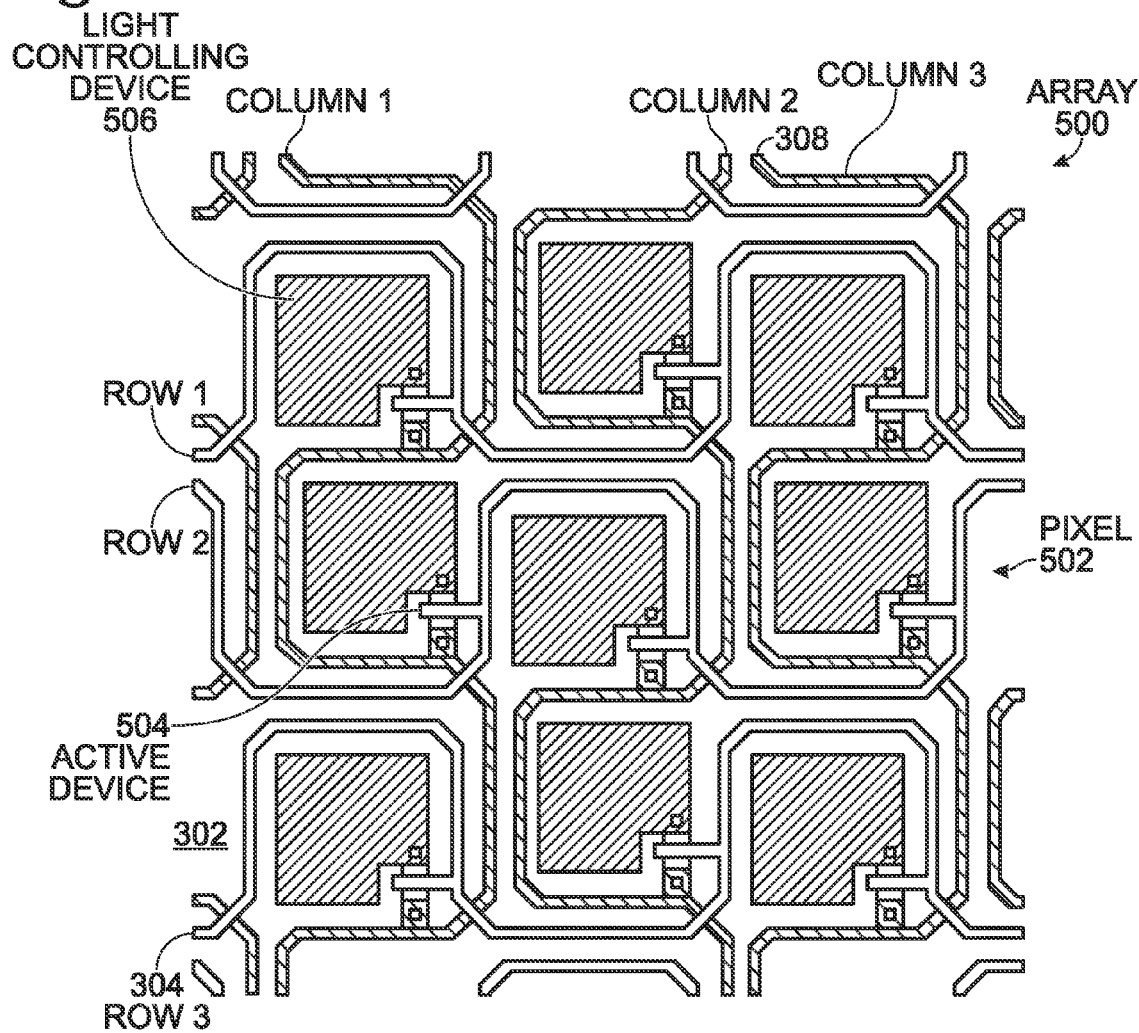
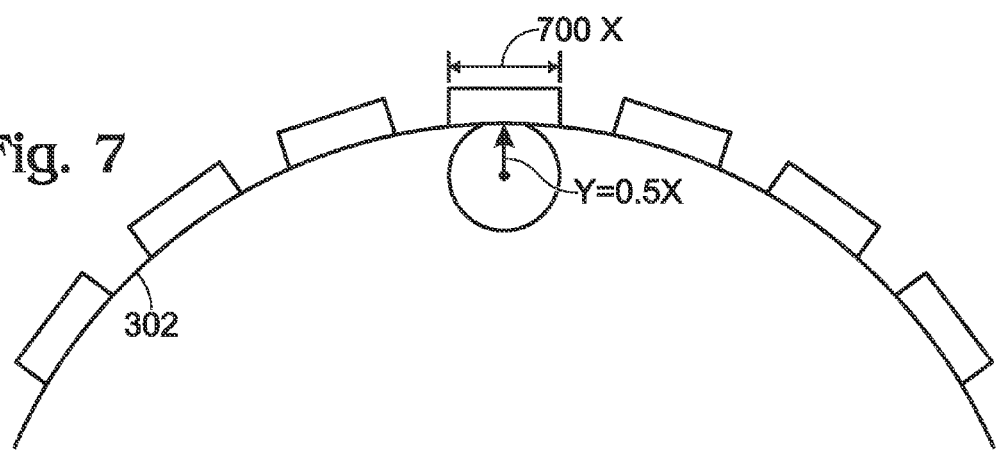

PIXEL DESIGN FOR FLEXIBLE ACTIVE MATRIX ARRAY

BACKGROUND OF THE INVENTION

1. Field of the Invention

This invention generally relates to printed circuit board (PCB) design and, more particularly, to a PCB design permitting substrate flexibility, such as might be useful with a flexible electronic array.

2. Description of the Related Art

Many reliability problems have been associated with the use of flexible thin-film active-matrix arrays, when subjected to repetitive or extreme flexing. It is well-known that when subjecting the materials that are used to make the array to high stress/strain, that micro-cracks, delamination, and other defects appear. These defects result in the degradation of the film's performance, and eventually in its complete failure. In particular, conductive, brittle layers are especially prone to this problem. Even softer materials, such as aluminum, will exhibit degradation in their conductivity under repetitive flexing, before failure in the form of electrical opens. This problem is currently addressed by (a) confining the flexible array in a suitable enclosure, which allows limited flexing, so that extreme bending radius is not allowed, and flexing is confined to certain axes or directions of the array plane, or (b) laminating protective layers at the top/bottom to mitigate stresses in the active plane, which also limits flexibility.

FIG. 1 shows an exemplary layout of the gate and data lines in a typical active-matrix liquid-crystal display (AMLCD) array (prior art). A detail of 3×3 pixels is shown. Experimental data has shown that it is these long lines, with a typical width of 5-20 microns, thicknesses on the order of 1 micron, and a length in the 10-100 centimeter (cm) range (depending on array size and resolution), that are the main failure points under repetitive or tight radius bending.

FIGS. 2A and 2B depict the application of stress to a conventional straight line on a PCB (prior art). Shown in FIG. 2A is the line prior to the application of stress. When tensile stress is applied in the X-axis (FIG. 2B), this design is shown to suffer from crack formation in the metal film length, resulting in degraded conductivity, and eventually open-circuit (breakage) failure. At compressive stress along the X-axis, delamination is often seen, depending on the metal and substrate material.

It would be advantageous if conductive lines on a PCB could be designed to have greater resistance to flexing and stress.

SUMMARY OF THE INVENTION

Disclosed herein is a printed circuit board with conductive traces based on a serpentine design, to mitigate stress/strain to these lines when the underlying substrate is flexed. This design is considerably more robust against stress in any axis in which the substrate is flexed, as compared to straight lines, assuming that the period of the serpentine is short enough, so that the metal line is flat at each segment of this length, under the tightest radius of curvature expected. With respect to lines forming an array, the serpentine design of both the row and column lines (e.g., used to address a display or optical receiver) mitigates the stress under flexing.

In contrast to the conventional straight line approach, one advantage of the serpentine array design described herein, is that it is not contingent on the location of the neutral plain of the flexible circuit board. Also, the serpentine line design does not substantially modify the neutral plane of the array, compared to the prior art, and therefore it does not require any modification in the pattern, thickness, or materials of other array layers.

Accordingly, a flexible active matrix array is provided. The array is made with a flexible substrate and an array of pixels overlying the substrate, where each pixel includes an active device and a light controlling device. The array also includes a plurality of parallel row lines overlying he substrate, with each row line formed in serpentine pattern with a plurality of partial-loops, to supply a first signal to a corresponding plurality of pixels. A plurality of parallel column lines overlies the substrate, orthogonal to the row lines. Each column line is formed in a serpentine pattern with a plurality of partial-loops, to supply a second signal to a corresponding plurality of pixels. Each pixel has a border, with each row line partial-loop formed along about 75% of a pixel border, and each column line partial-loop formed along about 75% of a pixel border. Alternatively stated, each row line partial-loop has an opening on a corresponding pixel border, and each column line partial-loop has an opening on a corresponding pixel border, orthogonal to the row line partial-loop opening. Row line partial-loop openings of row-adjacent pixels are 180 degrees out of phase, and column line partial-loop openings of column-adjacent pixels are 180 degrees out of phase.

Typically, the row and column line partial-loops have a 3-sided rectangular shape with chamfered corners, and the row and column line partial loops cross at their respective chamfered corners. If the row and column line partial-loops have a maximum side length of X, then the array substrate has a minimum radius of curvature of Y=0.5X.

Additional details of the above-described array and a printed circuit board design are presented below.

BRIEF DESCRIPTION OF THE DRAWINGS

FIG. 5 is a plan view of a flexible active matrix array.

FIG. 7 is a partial cross-sectional view of a second detail of either FIG. 4 or FIG. 5.

DETAILED DESCRIPTION

Figure 1:
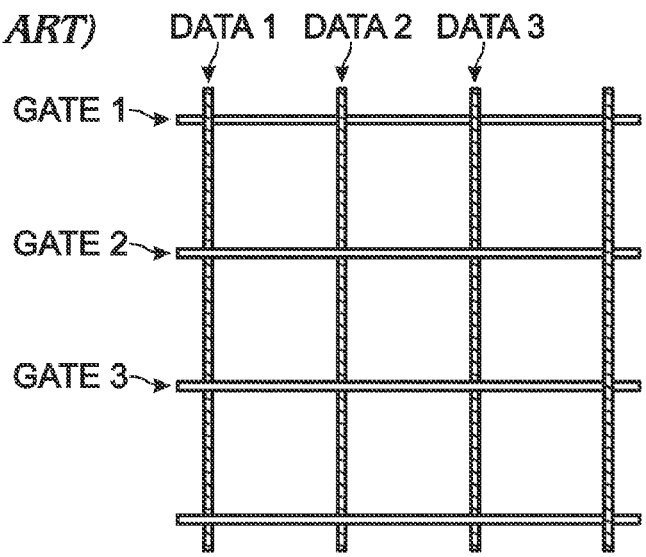
FIG. 1 shows an exemplary layout of the gate and data lines in a typical active-matrix liquid-crystal display (AMLCD) array (prior art).
Figure 2A:
FIGS. 2A and 2B depict the application of stress to a conventional straight line on a PCB (prior art).
Figure 3A:
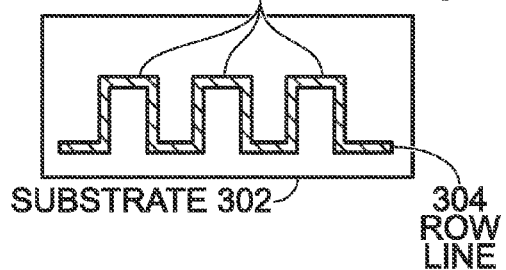
FIGS. 3A and 3B are views of a flexible printed circuit board (PCB).
Figure 2B:
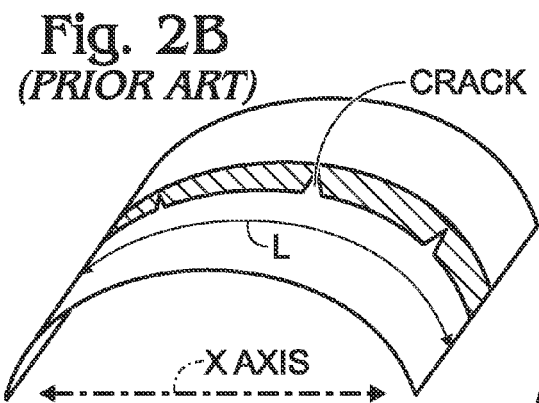
Figure 3B:
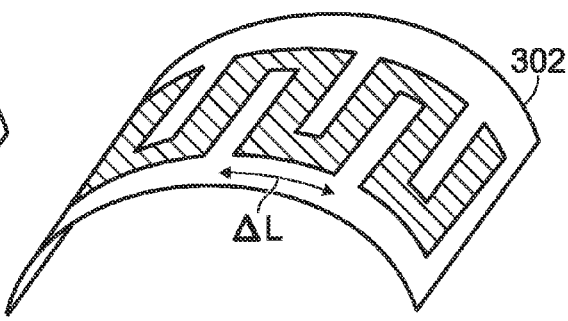

FIGS. 3A and 3B are views of a flexible printed circuit board (PCB). The PCB 300 comprises a flexible substrate 302 and a row line 304 overlying the substrate 302, formed in serpentine pattern with a plurality of partial-loops 306. As shown in FIG. 3B, the short length of the partial-loops components (ΔL) mitigate against the formation of cracks when the substrate 302 is flexed, in contrast to the PCB of FIG. 2B.

Figure 4:
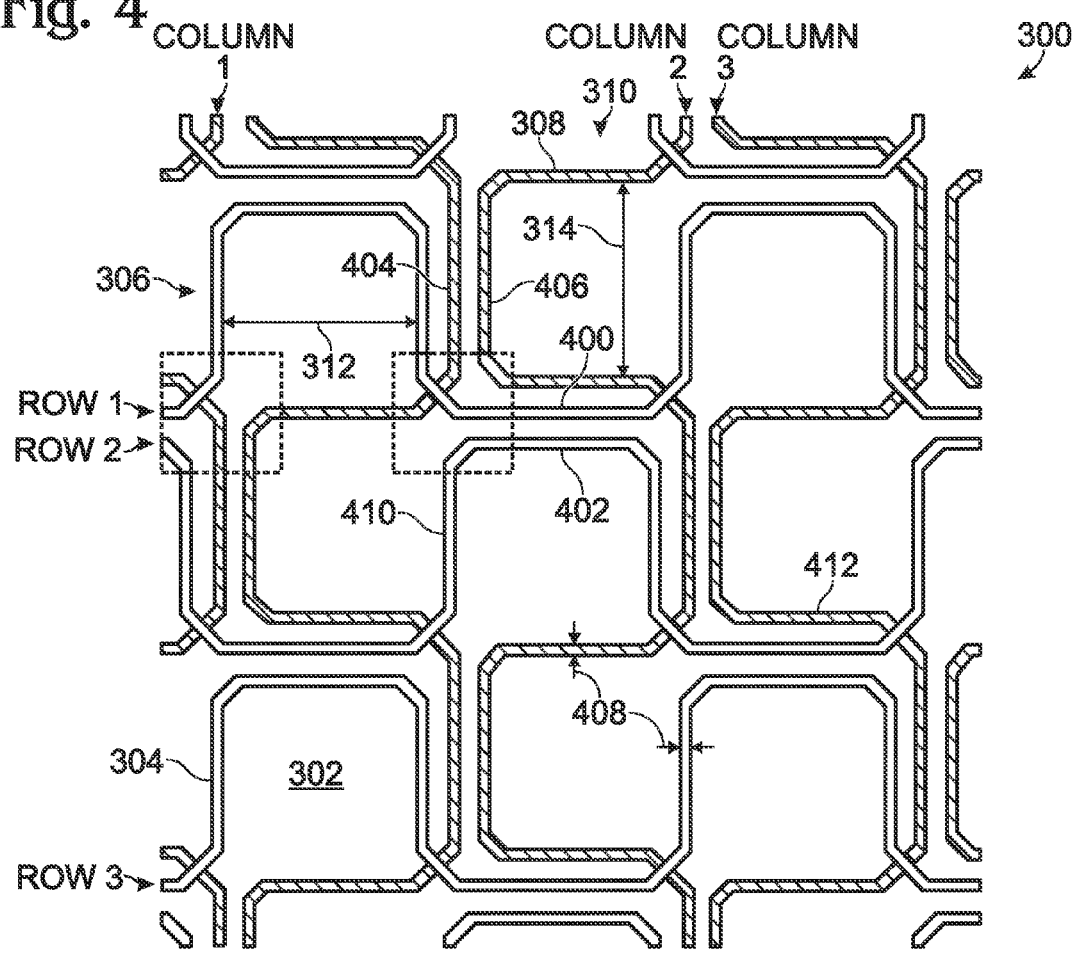
FIG. 4 is a plan view of a variation of the PCB of FIG. 3A.

FIG. 4 is a plan view of a variation of the PCB of FIG. 3A. In this aspect, a plurality of parallel row lines 304 overlies the substrate 302. Each row line is formed in serpentine pattern with a plurality of partial-loops 306. A plurality of parallel column lines 308 overlies the substrate 302, orthogonal to the row lines 304. Each column line 308 is formed in a serpentine pattern with a plurality of partial-loops 310. A 3×3 pattern is shown, but the PCB is not necessarily so limited. As shown, the row line partial-loops 306 have a 3-sided rectangular shape with an opening 312, with the openings of row-adjacent pixels 180 degrees out of phase. Likewise, the column line partial-loops 310 have a 3-sided rectangular shape, with the openings 314 of column-adjacent pixels 180 degrees out of phase. In this example, the 3-sides rectangles are 3-sided squares, with the lengths of all the row and columns sides being equal. Alternatively but not shown, the 3-sided rectangles may have unequal length sides, and the lengths the sides for the row line partial-loops may be different than the side lengths for the column line partial loops.

The figure also shows that the row line partial-loop openings 312 of column-adjacent pixels are 180 degrees out of phase, and the column line partial-loop openings 314 of row-adjacent pixels are 180 degrees out of phase. More explicitly, the middle side 400 of a row line partial-loop for a pixel in a (2n+1)th row (e.g., row 1, n=0) and a (2m+2)th column (e.g., column 2, m=0) where n and m are integers greater than or equal to zero, is parallel to and adjacent a middle side 402 of a row line for a pixel in a (2n+2)th row (e.g., row 2) and the (2m+2)th column (e.g., column 2). Likewise, the middle side 404 of a column line partial-loop for a pixel in the (2n+1)th row and a (2m+1)th column (e.g., row 1, column 1), is parallel to and adjacent a middle side 406 of a column line for a pixel in the (2n+1)th row and the (2m+2)th column (e.g., row 1, column 2).

FIG. 5 is a plan view of a flexible active matrix array. The array 500 comprises a flexible substrate 302. The substrate 302 may be transparent, semi-transparent, or opaque. Some exemplary materials include intrinsic semiconductor materials, silica, plastic, and metal foil. An array of pixels 500 overlies the substrate 302. Each pixel 502 comprises an active device 504 and a light controlling device 506. For example, the active device 506 comprises at least one thin-film transistor (TFT), although multiple TFTs may also be used. The light controlling device 504 may be a light emitting device (LED) or a transparent electrode connected to an underlying liquid crystal (LC) region (not shown) for display applications, or a photodiode for camera applications. Typically, the light controlling device 506 is in electrical communication with an underlying counter electrode (not shown) to complete an electrical circuit. The array of FIG. 5 may be fabricated, for example, on the PCB of FIG. 4.

A plurality of parallel row lines 304 overlie the substrate 302, each row line is formed in serpentine pattern with a plurality of partial-loops (as labeled in FIG. 4), to supply a first signal to a corresponding plurality of pixels 502. A plurality of parallel column lines 308 overlies the substrate 302, orthogonal to the row lines 304. Each column line 308 is formed in a serpentine pattern with a plurality of partial-loops (as labeled in FIG. 4), to supply a second signal to a corresponding plurality of pixels.

Each pixel 502 has a border, and each row line partial-loop is formed along about 75% of a corresponding pixel border. Likewise, each column line partial-loop is formed along about 75% of a corresponding pixel border. The column and row lines of FIG. 5 are the same as shown in FIG. 4. Referencing FIG. 4 for greater clarity, the pixel of FIG. 5 would correspond to the empty regions surrounded by the column and row lines, and the pixel border would be where the empty region intercepts the surrounding row and column lines. Then, each row line partial-loop 306 has an opening (as labeled in FIG. 4) on a corresponding pixel border, and each column line partial-loop 310 has an opening on a corresponding pixel border, orthogonal to the row line partial-loop opening 306. The row line partial-loop openings 312 of row-adjacent pixels are 180 degrees out of phase, and the column line partial-loop openings 314 of column-adjacent pixels are 180 degrees out of phase. Alternatively stated, the row line partial-loop openings 312 of column-adjacent pixels are 180 degrees out of phase, and the column line partial-loop openings 314 of row-adjacent pixels are 180 degrees out of phase.

As seen more clearly in FIG. 4, the row line partial-loops 306 have a 3-sided rectangular shape. The middle side 400 of a row line partial-loop for a pixel in a (2n+1)th row and a (2m+2)th column, where n and in are integers greater than or equal to zero, is parallel to and adjacent a middle side 402 of a row line for a pixel in a (2n+2)th row and the (2m+2)th column. Likewise, the column line partial loops 310 has a 3-sided rectangular shape. The middle side 404 of a column line partial-loop for a pixel in the (2n+1)th row and a (2m+1)th column, is parallel to and adjacent a middle side 406 of a column line for a pixel in the (2n+1)th row and the (2m+2)th column.

Referencing FIG. 4, the last side 410 of a row line partial-loop for a first pixel (e.g., row 2, column 1) is a first side of a row line partial-loop of a second pixel, adjacent to the first pixel in a row (e.g., row 2, column 2). Likewise, the last side 412 of a column line partial-loop for a first pixel (e.g., row 2, column 3) is a first side of a column line partial-loop of a second pixel, adjacent to the first pixel in a column (e.g., row 3, column 3). Typically, the row and column lines have a width 408 in the range of 5 to 20 microns, and a thickness in the range of 1 to 2 microns. Note: although the row and column line partial-loops 306 and 310 have been shown as 3-sided rectangles, alternatively they may be formed in a semicircular shape with an arc of 270 degrees.

Figure 6A:
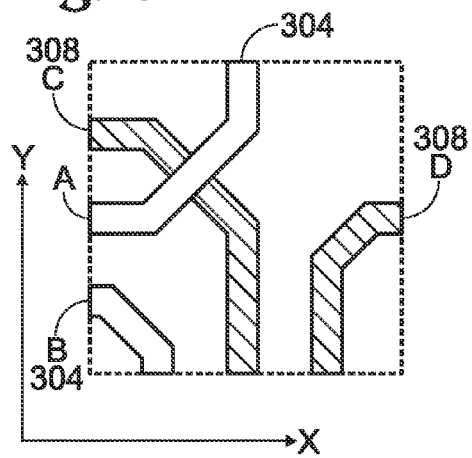
FIGS. 6A and 6B are plan views of a first detail of either FIG. 4 or FIG. 5.
Figure 6B:
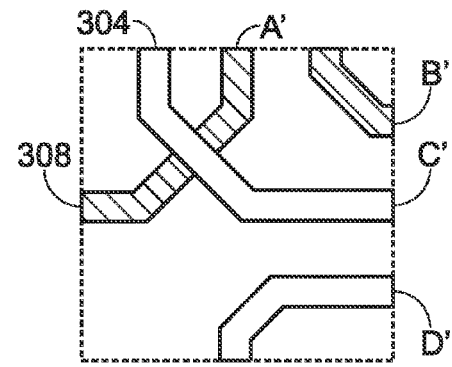

FIGS. 6A and 6B are plan views of a first detail of either FIG. 4 or FIG. 5. In this aspect, the row and column line partial-loops have a 3-sided rectangular shape with chamfered corners 600. As shown, the row and column line partial loops cross at their respective chamfered corners. Note that the overlap designs of FIGS. 6A and 6B are essentially the same design, mirrored in X or Y axes and rotated (i.e. A' is the same structure as A, B' is the same structure as B, etc.). In the first overlap tile (FIG. 6A), A and B are row lines, C and D are the column lines. In the second overlap tile (FIG. 6B), A' and B' are column lines, and C' and D' are the row lines.

FIG. 7 is a partial cross-sectional view of a second detail of either FIG. 4 or FIG. 5. Here, some sides of row line partial-loops are shown with a length 700 of X in axis Z. The substrate 302 has a minimum radius of curvature of Y=0.5X in the Z axis. Alternatively, side length 700 may be associated with column line partial-loops. Assuming the row and column partial-loops are formed as 3-sided squares of equal size, the radius of curvature is the same in all substrate axes. In the case where the partial-loop sides are unequal in length, the minimum radius of curvature is defined with respect to the longest length dimension. In some aspects, depending on the thickness and material type of the row and column lines, Y may be in the range of 0.6 to 2.0X.

The design of FIG. 5 is suitable for flexible applications, and can be applied to LC display (LCD), organic light emitting diode (OLED), and other display technologies, by using the appropriate pixel architecture. The design may alternatively be described as running three lines running between pixels in two neighboring rows (two row lines and one column line), or two column lines and one row line. There are three lines running between pixels in two neighboring columns (two column lines and one row line, or two row lines and one column line. There are two types of line intersections at the corners of each pixel, type A and type B (FIGS. 6A and 6B), where types A and B alternate between each other as the array is traversed from one row to the next, and one column to the next. In a type A intersection, one row line connects from North to West (up to down on the page), a second row line connects from South to West (left), one column line connects from South to West, and a second column line connects from South to East (right). In a type B intersection, one row line connects from North to East, a second row line connects from South to East, one column line connects from North to West, and a second column line connects from North to East. A and B can both be simultaneously rotated by any angle (90°, 180°, etc.) while maintaining the same interconnect topology.

A 3×3 pixel detail of the proposed interconnect design is shown in FIG. 4. The interconnect tiles are indicated by the dashed lines. The design of the pixel thin-film transistors (TFTs) and other elements (capacitors, resistors, photo- and light emitting diodes), and how they are integrated with the column/row network would be understood by one with skill in the art.

The above-described design has the following advantages:

(a) the mitigation of stress and strain effects in both X and Y axes;

(b) maintenance of Manhattan-geometry pixel layout of conventional designs;

(c) no modification of the outside connections to the display, the driving architecture, scheme, and electronics (i.e. each row and column line activates a continuous row and column of pixels, respectively);

(d) each pixel has access to both row and column lines on all sides;

(e) maintenance of overlap capacitance between row and column gate and data lines;

(f) compatible with passive-matrix architectures (OLED, LCD, electrophoretic, etc.); and, (g) maintenance of the neutral plane of the entire system, so that modifications to the thickness, material, or patterning of other layers are not required.

A neutral plane is a plane somewhere in the stack of deposited materials on the flexible substrate, where stress (under bending) is zero. For example, if a foil of some thickness is bent, then the top surface will experience compressive stress, while the bottom surface experiences tensile stress. Somewhere is a plane within the thickness of the foil (exactly in the middle, if the material is homogeneous), where there is no stress. An equivalent phenomenon occurs in multiple material stacks, with the location of the neutral plane is determined by the thicknesses and stiffness of the layers that make the stack. It is therefore desirable to design the stack so the most sensitive material of the stack (typically indium tin oxide (ITO)) falls on the neutral plane. However, designing a neutral plane is difficult, and only one layer will typically benefit from being on the neutral plane. Advantageously, the use of a PCB with serpentine row and column lines some not change the determination of a neutral plane originally designed for a PCB with straight row and column lines.

The above advantages are achieved at the expense of the following attributes:

(a) increased gate and data line length (by about 2×):

(b) need to rotate the pixel design, to have access to the same row and column line points in every pixel location;

(c) reduced pixel area, since the metal routing streets are approximately increased in width by 3×.

However, these shortcomings are manageable, and can he tolerated in large-area, large pixel applications. Point (c) is not valid for all pixel designs. Some emissive technologies, such top-emitting OLED, are immune to a reduction in aperture ratio as a consequence of a more dense metal interconnect network.

A PCB and array design using serpentine line traces to mitigate the effects of hoard stress have been provided. Examples of particular materials and layout details have been presented to illustrate the invention. However, the invention is not limited to merely these examples. Other variations and embodiments of the invention will occur to those skilled in the art.

I claim:

1. A flexible active matrix array, the array comprising:
a flexible substrate;
an array of pixels overlying the substrate, each pixel having a length (L) and a width (W), and comprising an active device and a light controlling device;
a plurality of parallel row lines overlying the substrate, each row line formed in a serpentine pattern with a plurality of partial-loops having a period (T1), to supply a first signal to a corresponding plurality of pixels; and,
a plurality of parallel column lines overlying the substrate, orthogonal to the row lines, each column line formed in a serpentine pattern with a plurality of partial-loops having a period (T2), to supply a second signal to a corresponding plurality of pixels; and,
wherein T1 is greater than L, and wherein T2 is greater than W.

2. The array of claim 1 wherein each pixel has a border;
wherein each row line partial-loop is formed along about 75% of a corresponding pixel border; and,
wherein each column line partial-loop is formed along about 75% of a corresponding pixel border.

3. The array of claim 2 wherein each row line partial-loop has an opening on a corresponding pixel border; and,
wherein each column line partial-loop has an opening on a corresponding pixel border, orthogonal to the row line partial-loop opening.

4. The array of claim 3 wherein the row line partial-loop openings of row-adjacent pixels are 180 degrees out of phase; and,
wherein the column line partial-loop openings of column-adjacent pixels are 180 degrees out of phase.

5. The array of claim 4 wherein the row line partial-loop openings of column-adjacent pixels are 180 degrees out of phase; and,
wherein the column line partial-loop openings of row-adjacent pixels are 180 degrees out of phase.

6. The array of claim 4 wherein the row line partial-loops have a 3-sided rectangular shape comprising a first side, a middle side, and a last side; and,
wherein a middle side of a row line partial-loop for a pixel in a (2n +1)th row and a (2m +2)th column, where n and m are integers greater than or equal to zero, is parallel to and adjacent a middle side of a row line for a pixel in a (2n +2)th row and the (2m +2)th column.

7. The array of claim 6 wherein the column line partial-loops have a 3-sided rectangular shape comprising a first side, a middle side, and a last side; and,
wherein a middle side of a column line partial-loop for a pixel in the (2n +1)th row and a (2m +1)th column, is parallel to and adjacent a middle side of a column line for a pixel in the (2n +1)th row and the (2m +2)th column.

8. The array of claim 7 wherein the row and column line partial-loops have a 3-sided rectangular shape with chamfered corners.

9. The array of claim 8 wherein the row and column line partial loops cross at their respective chamfered corners.

10. The array of claim 6 wherein a last side of a row line partial-loop for a first pixel is a first side of a row line partial-loop of a second pixel, adjacent to the first pixel in a row.

11. The array of claim 7 wherein a last side of a column line partial-loop for a first pixel is a first side of a column line partial-loop of a second pixel, adjacent to the first pixel in a column.

12. The array of claim 4 wherein row and column line partial-loops have a side length of X in a first axis; and,
wherein the substrate has a minimum radius of curvature of V=0.5X in the first axis.

13. The array of claim 2 wherein the row and column line partial-loops have a shape selected from a group consisting of a 3-sided rectangular and semicircular with an arc of 270 degrees.

14. The array of claim 1 wherein the row and column lines have a width in a range of 5 to 20 microns, and a thickness in a range of 1 to 2 microns.

15. The array of claim 1 wherein the active device comprises at least one thin-film transistor (TFT) and the light controlling device is selected from a group consisting of a light emitting device (LED), a transparent electrode connected to an underlying liquid crystal (LC) region, and a photodiode.

16. The array of claim 1 wherein the flexible substrate is selected from a group consisting of transparent, semi-transparent, and opaque.

17. The array of claim 1 wherein T1 is greater than or equal to 2L, and wherein T2 is greater than or equal to 2W.

18. A flexible printed circuit board (PCB), the PCB comprising:
a flexible substrate;
a plurality of row lines overlying the substrate, formed in a serpentine pattern with a plurality of partial-loops having chamfered corners;
a plurality of parallel column lines overlying the substrate, each column line formed in a serpentine pattern with a plurality of partial-loops having chamfered corners; and,
wherein the row line partial-loops orthogonally cross the column line partial-loops at their respective chamfered corners.

19. The PCB of claim 18 wherein the row line partial-loops have a 3-sided rectangular shape with an opening, with the openings of row-adjacent pixels 180 degrees out of phase; and,
wherein the column line partial-loops have a 3-sided rectangular shape, with the openings of column-adjacent pixels 180 degrees out of phase.

20. The PCB of claim 19 wherein the row line partial-loop openings of column-adjacent pixels are 180 degrees out of phase; and,
wherein the column line partial-loop openings of row-adjacent pixels are 180 degrees out of phase.

21. The PCB of claim 20 wherein a middle side of a row line partial-loop for a pixel in a (2n +1)th row and a (2m +2)th column, where n and m are integers greater than or equal to zero, is parallel to and adjacent a middle side of a row line for a pixel in a (2n +2)th row and the (2m +2)th column; and,
wherein a middle side of a column line partial-loop for a pixel in the (2n +1)th row and a (2m +1)th column, is parallel to and adjacent a middle side of a column line for a pixel in the (2n +1)th row and the (2m +2)th column.

\* \* \* \* \*

UNITED STATES PATENT AND TRADEMARK OFFICE
CERTIFICATE OF CORRECTION

PATENT NO. : 9,363,889 B2
APPLICATION NO. : 14/470618
DATED : June 7, 2016
INVENTOR(S) : Themistokles Afentakis It is certified that error appears in the above-identified patent and that said Letters Patent is hereby corrected as shown below:

In the Claims

In column 7, line 8, claim 12, the formula "Y = 0.5X" has been incorrectly printed as --V=0.5X--.

Signed and Sealed this
Ninth Day of August, 2016

Michelle K. Lee
*Director of the United States Patent and Trademark Office*